US006920080B2

United States Patent
Chung et al.

(10) Patent No.: US 6,920,080 B2
(45) Date of Patent: Jul. 19, 2005

(54) METHODS FOR GENERATING OUTPUT CONTROL SIGNALS IN SYNCHRONOUS SEMICONDUCTOR MEMORY DEVICES AND RELATED SEMICONDUCTOR MEMORY DEVICES

(75) Inventors: Dae-hyun Chung, Daejeon (KR); Sang-woong Shin, Seoul (KR)

(73) Assignee: Samsung Electronics Co., Ltd. (KR)

( * ) Notice: Subject to any disclaimer, the term of this patent is extended or adjusted under 35 U.S.C. 154(b) by 21 days.

(21) Appl. No.: 10/702,366

(22) Filed: Nov. 6, 2003

(65) Prior Publication Data

US 2004/0109382 A1 Jun. 10, 2004

(30) Foreign Application Priority Data

Dec. 10, 2002 (KR) ................................. 10-2002-0078386

(51) Int. Cl.[7] ................................................ G11C 8/00
(52) U.S. Cl. ................... 365/233; 365/194; 365/230.08
(58) Field of Search ................................. 365/233, 194, 365/230.08, 230.02, 225.7

(56) References Cited

U.S. PATENT DOCUMENTS 6,556,505 B1 * 4/2003 Tojima et al. .............. 365/233
2002/0093871 A1   7/2002 Kwak ........................ 365/233

* cited by examiner

Primary Examiner—David Lam
(74) Attorney, Agent, or Firm—Myers Bigel Sibley & Sajovec

(57) ABSTRACT

A synchronous semiconductor memory device includes an output control signal generating circuit that generates a data output control signal in response to an internal clock signal, an output control clock signal and a CAS latency signal. The output control signal generating circuit successively shifts read information signals in response to the internal clock signal and the output control clock signal, both source clocks of which are identical, and generates one of the shifted read information signals as an output control signal for indicating a data output period in response to the CAS latency signal. The synchronous semiconductor memory device can synchronize the source clocks of the clock signals used in the output control signal generating circuit thereby reducing the influence of clock jitter.

23 Claims, 6 Drawing Sheets

METHODS FOR GENERATING OUTPUT CONTROL SIGNALS IN SYNCHRONOUS SEMICONDUCTOR MEMORY DEVICES AND RELATED SEMICONDUCTOR MEMORY DEVICES

RELATED APPLICATION

This application claims the priority of Korean Patent Application No. 2002-78386 filed on Dec. 10, 2002, in the Korean Intellectual Property Office, the disclosure of which is incorporated herein in its entirety by reference.

FIEL OF THE INVENTION

The present invention relates to semiconductor memory devices, and more particularly, to methods for generating output control signals in synchronous semiconductor memory devices and related synchronous semiconductor memory devices.

DESCRIPTION OF THE RELATED ART

Semiconductor memory devices are used as the primary memory storage device in many computer systems. The rate at which data may be input to or output from a semiconductor memory device may be an important factor in determining the operating speed of the computer system. To improve operating speeds of semiconductor memory devices, synchronous dynamic random access memory (SDRAM) devices have been used in which the memory device operates in synchronization with an external clock signal generated by the computer system.

SDRAM memory devices may use a Column Address Strobe (CAS) latency function to increase the speed of operation. The CAS latency is defined as the time delay that is needed from the time of application of a read command before an output data signal generated by the memory device can be presumed to be valid. This time delay can be represented as an integer number of cycles of the external clock signal. The read command is typically synchronized with the external clock.

FIG. 1 is a circuit diagram of an output control signal generating circuit 100 of a conventional synchronous semiconductor memory device. Referring to FIG. 1, the output control signal generating circuit 100 includes a multiplexer 110, a shift register 130, and first, second, third, and fourth delay circuits 151–154. An example of the output control signal generating circuit 100 of FIG. 1 is disclosed in U.S. Patent Publication No. 2002/0093871.

As shown in FIG. 1, the shift register 130 comprises a plurality of flip-flop circuits 131–136. A read information signal PREAD and an internal clock signal PCLK are input to flip-flop 131. The shift register 130 successively shifts the read information signal PREAD in response to the internal clock signal PCLK and an output control clock signal PCLKDQ that is input to flip-flops 132–136. Prior to being input to flip-flops 132–135, the output control clock signal PCLKDQ is delayed through one or more delay circuits 151–154. Thus, the read information signal is successively shifted through the shift register 130 in responses to two different clock signals, internal clock signal PCLK and the output control clock signal PCLKDQ.

The internal clock signal PCLK may be generated through an input delay locked-loop circuit (not shown) that is included in the synchronous semiconductor memory device. Typically, the internal clock signal PCLK is synchronized with an external clock signal ECLK (not shown). The output control clock signal PCLKDQ may be generated through an output delay locked-loop circuit (not shown) that is included in the synchronous semiconductor memory device. Typically, the output control clock signal PCLKDQ is synchronized with rising and falling edges of the external clock signal. This output control clock signal is used to control the timing at which data is output from the synchronous semiconductor memory device. Typically, the output control clock signal PCLKDQ is generated before the generation of the corresponding external clock signal in order to satisfy a condition where tAC (output data access time from external clock) is zero.

The outputs of flip-flops 132–136 are input to the multiplexer 110. Each of these outputs correspond to a possible CAS latency value which, in the example of FIG. 1, correspond to CAS latency values CL3, CL4, CL5, CL6 and CL7. The multiplexer 110 outputs one of the output signals of the shift register 130 as an output control signal LATENCY based on the CAS latency signal (CLi, i=3, 4, 5, 6, 7) that is input to the multiplexer 110. The output control signal LATENCY is applied to an output buffer (not shown) included in the synchronous semiconductor memory device such that data is output from the device during an appropriate data output period.

FIG. 2 is an exemplary timing diagram illustrating a reduction that may occur in the available timing margin ("TM") for outputting data from a synchronous semiconductor memory device having the output control signal generating circuit of FIG. 1 as a result of clock jitter in the external clock.

In the exemplary timing diagram of FIG. 2, clock jitter TJ1 in the first cycle ECLK1 of the external clock signal ECLK shifts the duty cycle of the first cycle ECLK1 of the external clock signal from the desired ratio of 50%:50% to 55%:45%. Thus the duty cycle error associated with the first cycle ECLK1 is 5%. Likewise, clock jitter TJ2 in the a second cycle ECLK2 of the external clock signal ECLK shifts the duty cycle of the second cycle ECLK2 to 45%:55%, which again represents a duty cycle error of 5%. Subsequent cycles of the external clock signal ECLK are assumed to be unaffected by clock jitter.

As shown in FIG. 2, a read command READ is generated in synchronization with the second cycle ECLK2 of the external clock signal ECLK. In response to this READ command, a read information signal PREAD is activated to a high level for a predetermined period of time.

The internal clock signal PCLK is generated from (and hence synchronized with) the external clock signal ECLK. As shown in FIG. 2, the cycle of the internal clock signal labeled PCLK1 is generated from the second cycle ECLK2 of the external clock signal. As cycle ECLK2 has a duty cycle error of 5%, the cycle PCLK1 of internal clock signal PCLK likewise has a duty cycle error of 5%.

After cycle PCLK1 of the internal clock signal PCLK is activated to a high level both of the inputs to the first flip-flop 131 shown in FIG. 1 are at a high level. This causes the output Q of flip-flop 131 (which is designated PREAD1 in FIG. 2) to be activated to a high level for a predetermined time period (in this case 2 cycles of PCLK).

The output control clock signal PCLKDQ is also generated from (and hence synchronized with) the external clock signal ECLK. Output control clock signal PCLKDQ-A is a delayed version of signal PCLKDQ that corresponds to the signal present at the node labeled "A" in FIG. 1. As shown in FIG. 2, as signals PCLKDQ and PCLKDQ-A are generated from the external clock ECLK, the duty cycle error present in the first and second cycles of the external clock ECLK is likewise present in the corresponding cycles of output control clock signals PCLKDQ and PCLKDQ-A.

As shown in FIG. 2, once both PREAD1 and cycle PCLKDQ-A1 are both activated to high levels, the output Q (which is designated PREAD2 in FIG. 2) of flip-flop 132 is activated to a high level.

As shown in FIG. 2, in the absence of clock jitter on the external clock signal ECLK the timing margin for sampling the read information signal PREAD and the output signal PREAD1 of the first flip-flop 131 would be time TM1. However, because of the clock jitter present in the first and second cycles ECLK1 and ECLK2 of the external clock signal ECLK, a duty cycle error of 10% may result and the timing margin may be reduced to time TM2. Accordingly, clock jitter in the external clock signal may act to reduce the available timing margin which negatively impacts the speed of operation of the synchronous semiconductor memory device.

SUMMARY OF THE INVENTION

Pursuant to embodiments of the present invention, methods are provided for generating an output control signal in response to a read command that is received by a synchronous semiconductor memory device. Pursuant to these methods, a first and a second clock signal may be generated from an external clock signal. At least the first clock signal may then be passed through a delay circuit to provide a compensated first clock signal. This may be accomplished, for example, by passing the first clock signal through a delay circuit (such as a circuit including one or more unit cycle delay units) that delays the first clock signal by an integer number of clock cycles. An output control signal may then be generated based on a Column Address Strobe ("CAS") latency signal, the compensated first clock signal and the second clock signal. This method may be used to synchronize the compensated first clock signal and the second clock signal to the same cycle of the external clock signal.

In specific embodiments of the present invention, the first clock signal may be generated from an input delay locked-loop circuit so that the first clock signal is synchronized with the external clock signal after the lapse of an input locking time and the second clock signal may be generated from an output delay locked-loop circuit so that the second clock signal is synchronized with the external clock signal after the lapse of an output locking time. The amount of delay imposed on the first clock signal may be based on the value of the Column Address Strobe ("CAS") latency signal.

Pursuant to another embodiment of the present invention, methods of operating a synchronous semiconductor memory device are provided in which a first clock signal and a second clock signal are generated that are synchronized to different cycles of an external clock signal. The first clock signal and the second clock signal may then be synchronized to the same cycle of the external clock, and a data output control signal may be generated in response to a read information signal, a Column Address Strobe ("CAS") latency signal and the synchronized first and second clock signals. In these methods, the first clock signal may be an internal clock signal and the second clock signal may be an output control clock signal. The step of synchronizing the first clock signal and the second clock signal to the same cycle of the external clock may comprise delaying at least one of the first clock signal and the second clock signal by an integer number of clock cycles. Moreover, the amount that the first clock signal and/or the second clock signal are delayed may vary based on the value of the CAS latency signal.

Pursuant to another aspect of the present invention, synchronous semiconductor memory devices are provided that include (a) a first clock signal generation circuit, (b) a second clock signal generation circuit, (c) an output control signal generating circuit, (d) a first transfer/delay circuit and (e) an output buffer. The first clock signal generation circuit may generate a first clock signal that is synchronized with a first cycle of an external source clock while the second clock signal generation circuit generates a second clock signal that is synchronized with a second cycle of the external source clock. The first transfer/delay circuit may be coupled between the first clock signal generation circuit and the output control signal generating circuit, and may be used to delay the first clock signal so that the first clock signal and the second clock signal are synchronized to the same cycle of the external source clock. The output control signal generating circuit may be used to generate an output control signal in response to a read signal, a Column Address Strobe ("CAS") latency signal, the first clock signal and the second clock signal, and the output buffer outputs data in response to the output control signal.

In specific embodiments of these devices, the first transfer/delay circuit may comprise a plurality of transfer/delay units that act to delay the first clock signal by zero, one, two or three clock cycles. The device may also include a second transfer/delay circuit, that may be coupled between the second clock signal generation circuit and the output control signal generating circuit, that delays the second clock signal before it is passed to the output control signal generating circuit. Such a second transfer/delay circuit may also comprise a plurality of transfer/delay units that act to delay the second clock signal by zero, one, two or three clock cycles. The first and/or second transfer/delay circuits may comprise a plurality of delay circuits, each of which includes a plurality of unit cycle delay circuits that act to delay the first clock signal and a first multiplexer that, based on the CAS latency signal, selects the output of one of the delay circuits.

BRIEF DESCRIPTION OF THE DRAWINGS

The above features and advantages of the present invention will become more apparent by describing in detail exemplary embodiments thereof with reference to the attached drawings in which.

DETAILED DESCRIPTION OF THE PREFERRED EMBODIMENTS

Figure 1:
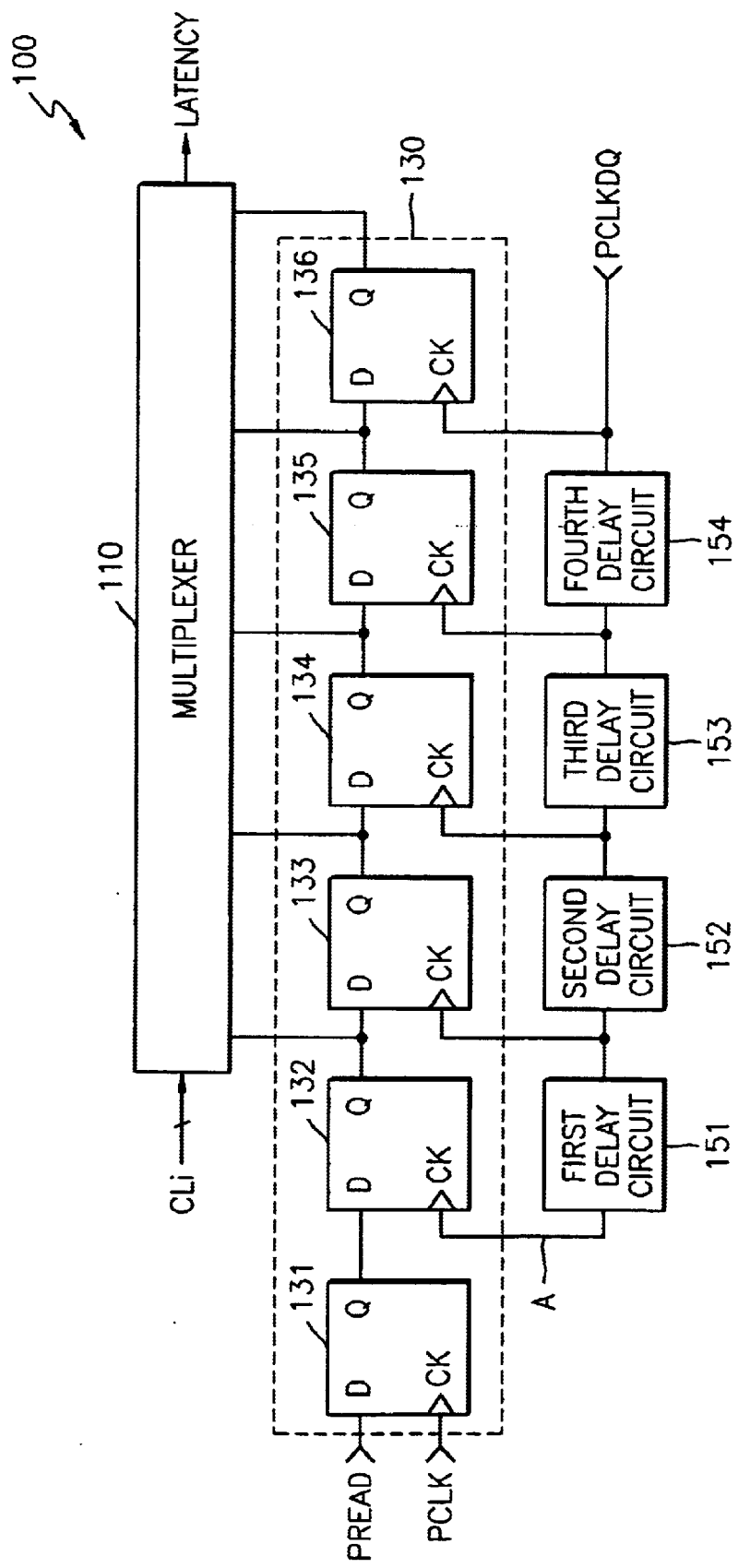
FIG. 1 is a circuit diagram of an output control signal generating circuit of a conventional synchronous semiconductor memory device.
Figure 2:
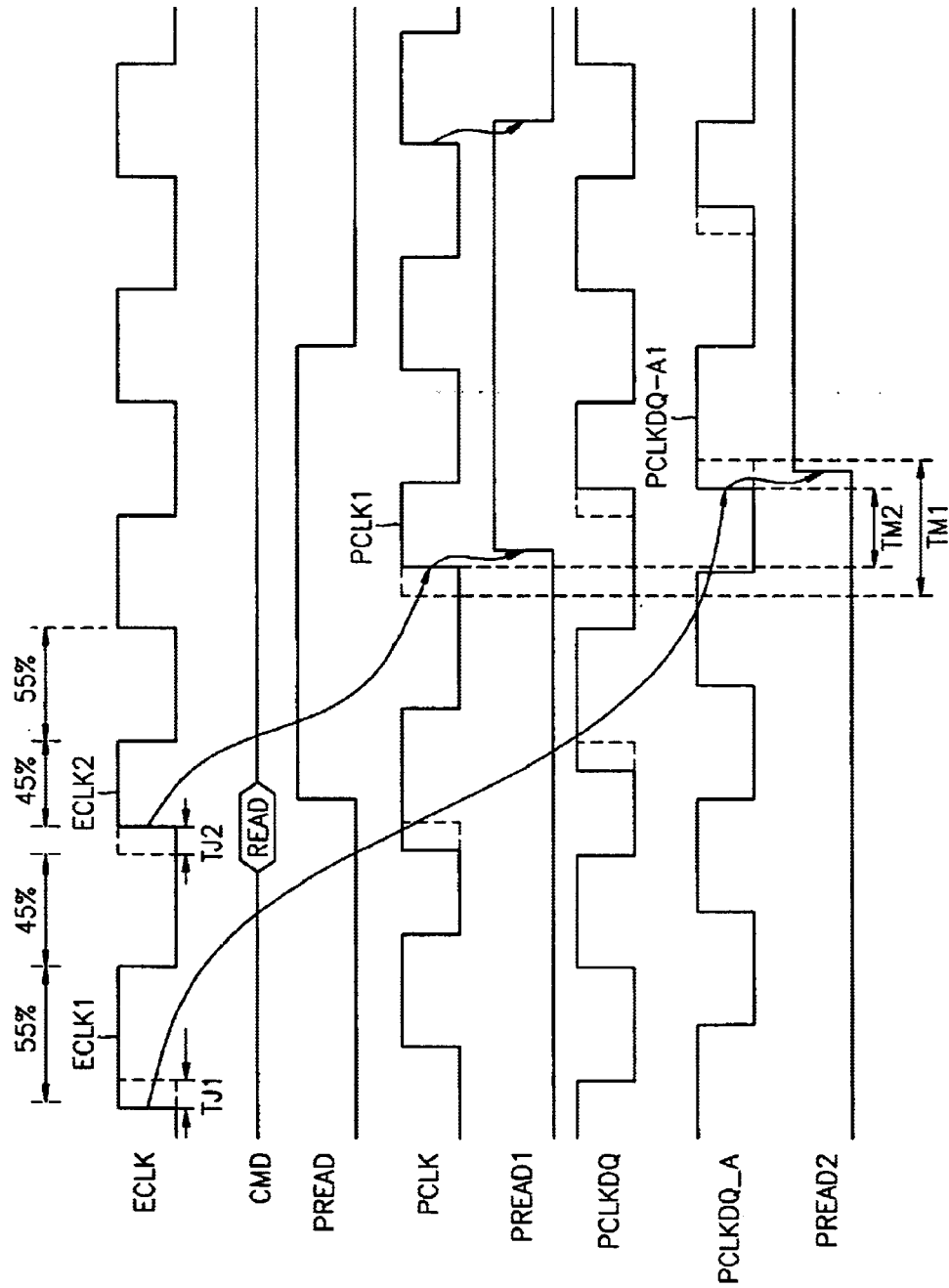
FIG. 2 is an exemplary timing diagram illustrating the reduction in the available timing margin in the output control signal generating circuit of FIG. 1 that may result if clock jitter is present.

The present invention will now be described more fully with reference to the accompanying drawings, in which typical embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. It will also be understood that when an element is referred to as being "coupled" or "connected" to another element that it can be directly coupled or connected to the other element or that intervening elements may also be present. In contrast, when an element is referred to as being "directly coupled" or "directly connected" to another element, there are no intervening elements present. Like reference numerals refer to like elements throughout this application.

Figure 3:
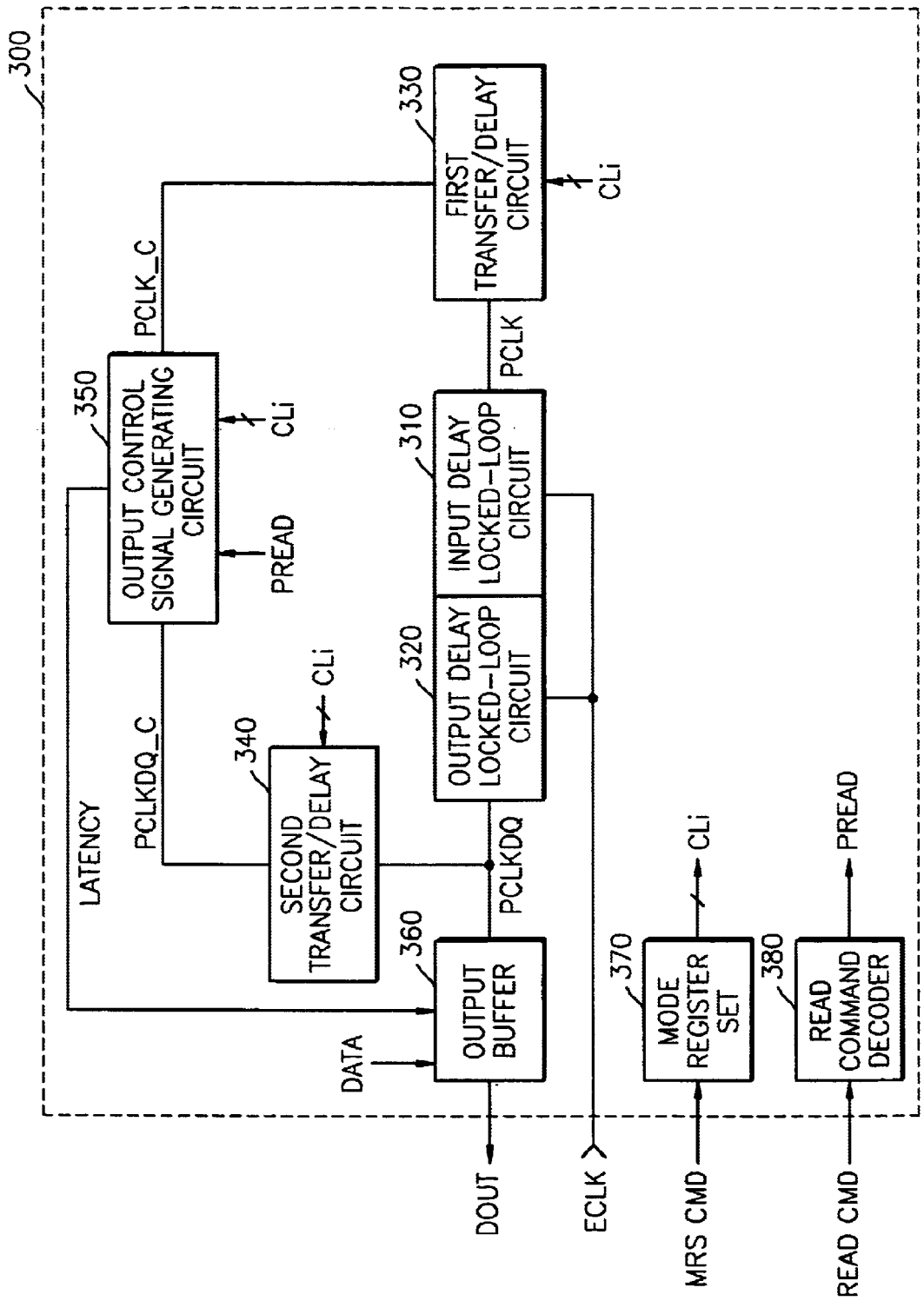
FIG. 3 is a block diagram of synchronous semiconductor memory devices according to embodiments of the present invention.

FIG. 3 is a block diagram of a synchronous semiconductor memory device according to first embodiments of the present invention. Referring to FIG. 3, the synchronous semiconductor memory device 300 comprises an input delay locked-loop circuit 310, an output delay locked-loop circuit 320, a first transfer/delay circuit 330, a second transfer/delay circuit 340, an output control signal generating circuit 350, an output buffer 360, a mode register set (MRS) 370, and a read command decoder 380.

The input delay locked-loop circuit 310 generates an internal clock signal PCLK which is synchronized with an external clock signal ECLK after the lapse of a pre-set input locking time. The input locking time may be, for example, TCC, 2TCC, or 3TCC where TCC is one cycle or one period of the external clock signal ECLK.

The output delay locked-loop circuit 320 generates an output control clock signal PCLKDQ which likewise is synchronized with the external clock signal ECLK after the lapse of a pre-set output locking time. The pre-set output locking time may be, for example, TCC, 2TCC, 3TCC, 4TCC, or 5TCC. The output control clock signal PCLKDQ controls operations such that data DOUT is output from the output buffer 360 in synchronization with the external clock signal ECLK. The input delay locking-loop circuit 310 and the output delay locked-loop circuit 320 may have a voltage controlled delay line (VCDL) in common.

The first transfer/delay circuit 330 may transfer the internal clock signal PCLK to the output control signal generating circuit 350 without delay or, alternatively, may delay the internal clock signal PCLK by at least one cycle (i.e., a unit period delay time) of the internal clock signal PCLK to synchronize the source clock of the internal clock signal PCLK with the source clock of the output control clock signal PCLKDQ. The output of the first transfer/delay circuit 330 may be a compensated internal clock signal that is designated PCLK_C in FIG. 3. The compensated internal clock signal PCLK_C may be identical to the internal clock signal PCLK in the situation where the internal clock signal is transferred without delay. As shown in FIG. 3, the CAS latency signal (CLi, i=3, 4, 5, 6, 7) is input to the first transfer/delay circuit 330, and the first transfer/delay circuit 330 varies the delay time of the internal clock signal PCLK with CAS latency. For example, when CAS latency is 3 and the operation frequency is 200 MHz, a unit period delay time is 5 ns. When the CAS latency is 6 and the operation frequency is 400 MHz, the unit period delay time is 2.5 ns.

The second transfer/delay circuit 340 likewise may transfer the output control clock signal PCLKDQ to the output control signal generating circuit 350 without delay or, alternatively, may delay the output control clock signal PCLKDQ by at least one cycle (i.e., a unit period delay time) to synchronize the source clock of the output control clock signal PCLK with the source clock of the internal clock signal PCLK. The output of the second transfer/delay circuit 340 is a compensated output control clock signal that is designated PCLKDQ_C in FIG. 3. The compensated output control clock signal PCLKDQ_C may be identical to the output control clock signal PCLKDQ in the situation where the output control clock signal is transferred without delay. As shown in FIG. 3, the CAS latency signal (CLi, i=3, 4, 5, 6, 7) is input to the second transfer/delay circuit 340, and the second transfer/delay circuit 340 varies the delay time of the output control clock signal PCLKDQ with CAS latency.

It should be noted that while the synchronous semiconductor memory device 300 depicted in FIG. 3 includes both a first transfer/delay circuit 330 and a second transfer/delay circuit 340, when the source clock of the internal clock signal PCLK leads the source clock of the output control clock signal PCLKDQ in phase only the first transfer/delay circuit 330 may be required, and when the source clock of the output control clock signal PCLKDQ leads the source clock of the internal clock signal PCLK in phase only the second transfer/delay circuit 340 may be required.

The output control signal generating circuit 350 may include the same components as those of the output control signal generating circuit 100 depicted in FIG. 1, except that PCLK_C and PCLKDQ_C are used as control signals instead of PCLK and PCLKDQ. As discussed above with respect to FIG. 1, the output control signal generating circuit 350 shifts a read information signal PREAD in response to the compensated internal clock signal PCLK_C and the compensated output control clock signal PCLKDQ_C and outputs one of the shifted read information signals as an output control signal LATENCY in response to the CAS latency signal CLi.

The output control signal LATENCY is input into the output buffer 360 along with the output control clock signal PCLKDQ. When the output control signal LATENCY is activated to a high state the internal data DATA stored in the synchronous semiconductor memory device is output as data DOUT during an appropriate output period.

The mode register set MRS 370 generates the CAS latency signal CLi in response to an MRS command. The read command decoder 380 decodes a read command READ CMD and generates the read information signal PREAD that is input to the output control signal generating circuit 350.

Figure 4:
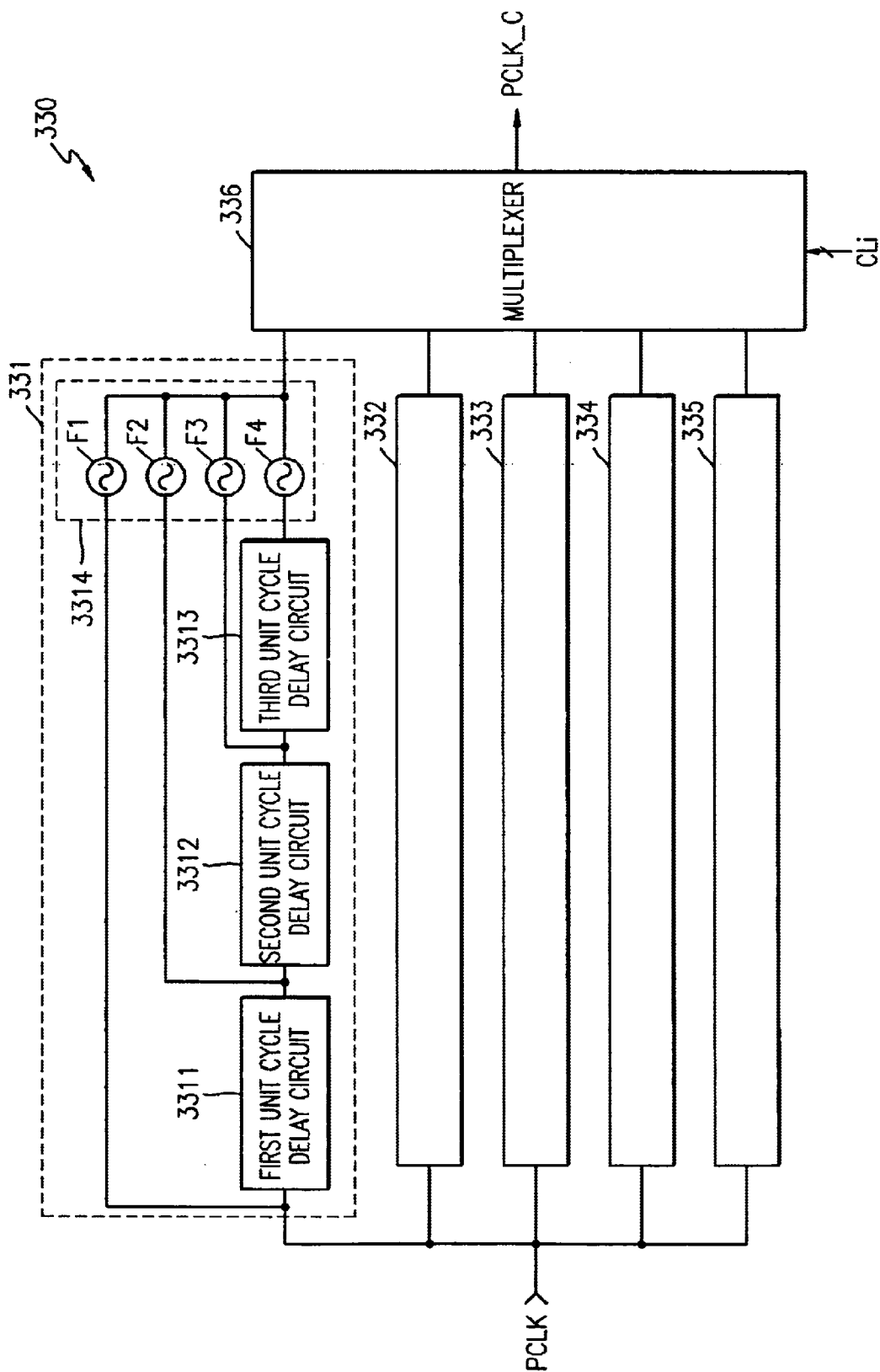
FIG. 4 is a detailed block diagram illustrating embodiments of first transfer/delay circuits of FIG. 3.

FIG. 4 is a detailed block diagram of a first transfer/delay circuit 330 of FIG. 3 according to embodiments of the present invention. As shown in FIG. 4, the first transfer/delay circuit 330 may include 5 individual transfer/delay circuits 331, 332, 333, 334, and 335, and a multiplexer 336. The first individual transfer/delay circuit 331 sets the delay for the case where the CAS latency signal CLi is 3, and this circuit includes a first unit cycle delay circuit 3311, a second unit cycle delay circuit 3312, a third unit cycle delay circuit 3313, and a plurality of fuses 3314. The second, third, fourth, and fifth individual transfer/delay circuits 332, 333, 334, and 335 each include the same components as those of the first individual transfer/delay circuit 331 and thus, for brevity, only the first individual transfer/delay circuit 331 is described herein. Circuit 332 sets the delay for the case where the CAS latency signal CLi is 4, circuit 333 sets the delay for the case where the CAS latency signal CLi is 5, circuit 334 sets the delay for the case where the CAS latency signal CLi is 6 and circuit 335 sets the delay for the case where the CAS latency signal CLi is 7.

The first individual transfer/delay circuit 331 transfers the internal clock signal PCLK to the multiplexer 336. The amount of delay, if any, imposed by the first individual transfer/delay circuit 331 depends on which of the fuses 3314 labelled F1–F4 are cut. For instance, when the internal clock signal PCLK should be delayed by two unit periods in order to synchronize the source clock of the internal clock signal PCLK with the source clock of the output control clock signal PCLKDQ, the third fuse F3 is not cut and the other fuses F1, F2, and F4 are cut. While embodiments of the present invention depicted in FIG. 4 generate the compensated internal clock signal PCLK_C using unit cycle delay circuits 3311–3313 and fuses 3314, it will be appreciated by those of skill in the art that it is also possible to implement the delay to the internal clock signal PCLK using other hardware. By way of example, metal options may be used instead of fuses for cutting off or connecting the transfer/delay paths to the multiplexer 336. Likewise, it will also be understood that while in the embodiment depicted in FIG. 4 each of the individual transfer/delay circuits 331–335 include 3 unit cycle delay circuits, each individual transfer/delay circuit 331–335 may include different numbers of unit cycle delay circuits in other embodiments.

The multiplexer 336 selects one of the internal clock signals PCLK that are transferred from the first, second, third, fourth, and fifth individual transfer/delay circuits 331, 332, 333, 334, and 335 based on the value of the CAS latency signal (CLi, i=3, 4, 5, 6, 7) to generate the compensated internal clock signal PCLK_C.

Figure 5:
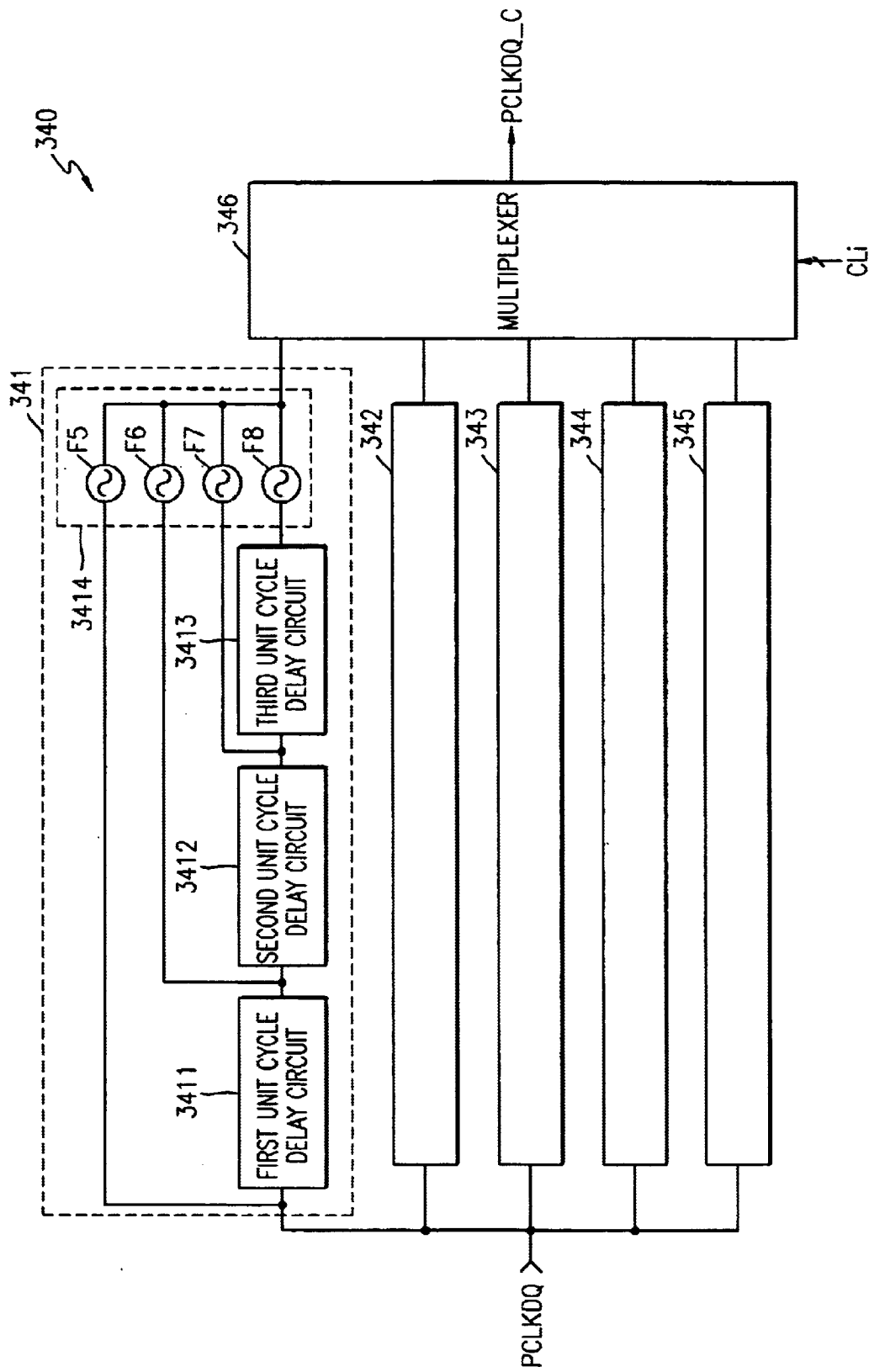
FIG. 5 is a detailed block diagram illustrating embodiments of the second transfer/delay circuits of FIG. 3.

FIG. 5 is a detailed block diagram of second transfer/delay circuits 340 of FIG. 3 according to embodiments of the present invention. As shown in FIG. 5, the second transfer/delay circuit 340 includes 5 individual transfer/delay circuits 341, 342, 343, 344, and 345, and a multiplexer 346. The sixth individual transfer/delay circuit 341 sets the delay for the case where the CAS latency signal CLi is 3, and this circuit includes a first unit cycle delay circuit 3411, a second unit cycle delay circuit 3412, a third unit cycle delay circuit 3413, and a plurality of fuses 3414. The seventh, eighth, ninth, and tenth individual transfer/delay circuits 342, 434, 344, and 345 each include the same components as those of the sixth individual transfer/delay circuit 341 and thus, for brevity, only the sixth individual transfer/delay circuit 341 is described herein. Circuit 342 sets the delay for the case where the CAS latency signal CLi is 4, circuit 343 sets the delay for the case where the CAS latency signal CLi is 5, circuit 344 sets the delay for the case where the CAS latency signal CLi is 6 and circuit 345 sets the delay for the case where the CAS latency signal CLi is 7.

The sixth individual transfer/delay circuit 341 transfers the output control clock signal PCLKDQ to the multiplexer 346. The amount of delay, if any, imposed by the sixth individual transfer/delay circuit 341 depends on which of the fuses 3414 labelled F5–F8 are cut. For instance, when the output control clock signal PCLKDQ should be delayed by two unit cycles to synchronize the source clock of the internal clock signal PCLK with the source clock of the output control clock signal PCLKDQ, the seventh fuse F7 is not cut and the other fuses F5, F6, and F8 are cut. While the embodiment of the present invention depicted in FIG. 5 generates the compensated output control clock signal PCLKDQ_C using unit cycle delay circuits 3411–3413 and fuses 3414, it will be appreciated by those of skill in the art that it is also possible to implement the delay to the output control clock signal PCLKDQ using other hardware. By way of example, metal options may be used instead of fuses for cutting off or connecting the transfer/delay paths to the multiplexer 346. Likewise, it will also be understood that while in the embodiments depicted in FIG. 5 each of the individual transfer/delay circuits 341–345 include 3 unit cycle delay circuits, each individual transfer/delay circuit 341–345 may include different numbers of unit cycle delay circuits in other embodiments.

The multiplexer 346 selects one of the output control clock signals PCLKDQ that are transferred from the sixth, seventh, eighth, ninth, and tenth individual transfer/delay circuits 341, 342, 343, 344, and 345 based on the value of the CAS latency signal (CLi, i=3, 4, 5, 6, 7) to generate the compensated output control clock signal PCLKDQ_C.

Figure 6:
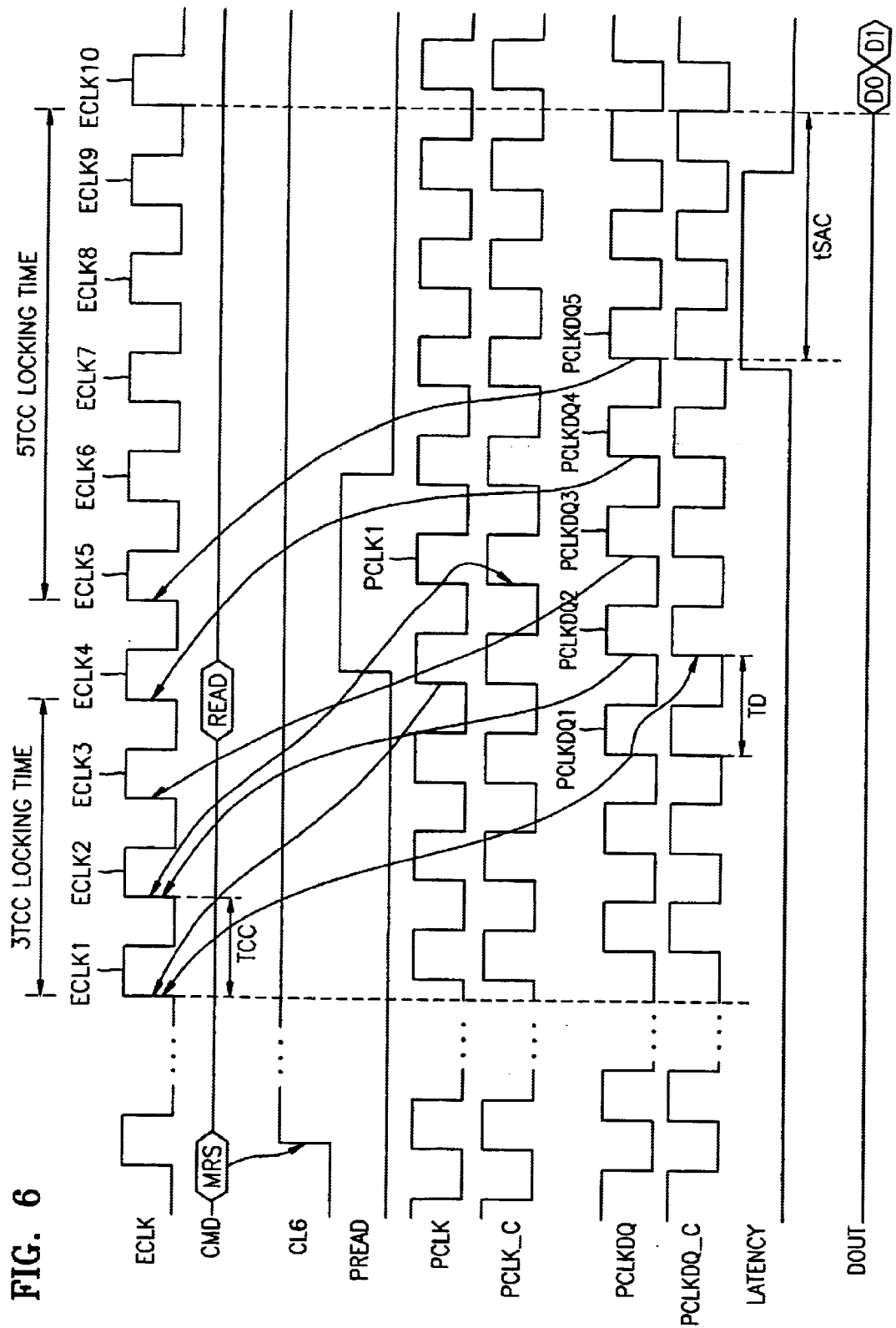
FIG. 6 is an exemplary timing diagram illustrating operations of the synchronous semiconductor memory devices according to embodiments of the present invention.

FIG. 6 is an exemplary timing diagram illustrating operations of embodiments of the synchronous semiconductor memory devices of the present invention for a CAS latency of 6.

As shown in FIG. 6, the MRS command MRS CMD is applied in synchronization with the external clock signal ECLK. As indicated by the arrow, this activates the CAS latency signal CL6 to a high level representing that the CAS latency of 6 is activated. Subsequently, the read command READ is applied in synchronization with the fourth cycle ECLK4 of the external clock signal ECLK. This causes the read information signal PREAD to be activated to a high level for a predetermined period of time.

In the example of FIG. 6, the input locking time of the input delay locked-loop circuit 310 of FIG. 3 is 3TCC. As is also shown in FIG. 6, the cycle PCLK1 of the first internal clock signal PCLK uses the second cycle (cycle ECLK2) of the external clock signal ECLK as a source clock. In the example of FIG. 6, the output locking time of the output delay locked-loop circuit 320 of FIG. 3 is 5TCC. As is also shown in FIG. 6, the cycle PCLKDQ1 of the output control clock signal PCLKDQ uses the first cycle (cycle ECLK1) of the external clock signal ECLK as a source clock.

As illustrated in FIG. 6, to synchronize the source clock (ECLK2) of the cycle PCLK1 of the internal clock signal PCLK with the source clock (ECLK1) of the cycle PCLKDQ1 of the output control clock signal PCLKDQ, a compensated output control clock signal PCLKDQ_C is generated by the second transfer/delay circuit 340 of FIG. 3 by delaying the output control clock signal PCLKDQ by a unit period (TD=TCC). The compensated output internal clock signal PCLK_C is generated by the first transfer/delay circuit 330 of FIG. 3 by transferring the internal clock signal PCLK without delay.

Meanwhile, the output control signal LATENCY, which is clocked and generated by the cycles of the output control clock signal designated PCLKDQ2, PCLKDQ3, and PCLKDQ4, are activated to a high level, before a subsequent cycle of the output control clock signal designated PCLKDQ5 on FIG. 6, which corresponds to the first valid output control clock signal. The output control clock signal PCLKDQ is set to be generated prior to tSAC (clock to valid output delay time) of FIG. 6, to satisfy the condition where tAC=0, and the tSAC is a fixed time regardless of the operation frequency. The data DOUT is output as first data D0 and second data D1 in synchronization with the rising and falling edges of the cycle of the external clock signal ECLK designated ECLK10.

In accordance with additional embodiments of the present invention, there are provided synchronous semiconductor memory devices that include an input delay locked-loop circuit, an output delay locked-loop circuit, an output control signal generating circuit and an output buffer. The input delay locked-loop circuit may generate an internal clock signal that is synchronized with an external clock signal after the lapse of an input locking time, and the output delay locked-loop circuit may generate an output control clock signal that is synchronized with the external clock signal after the lapse of an output locking time. The output control signal generating circuit may be used to successively shift read information signals in response to the internal clock signal and the output control clock signal, both source clocks of which are identical, so that one of the shifted read information signals is output as an output control signal for indicating a data output period in response to a CAS latency signal for indicating activation of CAS latency. The output buffer buffers internal data and outputs the data in response to a read command.

The synchronous semiconductor memory device may further include a first transfer/delay circuit which transfers the internal clock signal without delay or delays the internal clock signal by at least one cycle, in order to synchronize the source clock of the internal clock signal with that of the output control clock signal. The synchronous semiconductor memory device may also include a second transfer/delay circuit which transfers the output control clock signal without delay or delays the output control clock signal by at least one cycle to synchronize the source clock of the internal clock signal with that of the output control clock signal.

The first transfer/delay circuit may include a plurality of individual transfer/delay units which correspond to each possible CAS latency value. Each of these individual transfer/delay units may be used to transfer the internal clock signal through an uncut fuse without delay, or can be used to delay the internal clock signal through an uncut fuse by one, two or three cycles of the internal clock signal. The first transfer/delay circuit may also include a first multiplexer which selects one of the internal clock signals transferred/delayed via one of the individual transfer/delay circuits in response to the CAS latency signal.

The second transfer/delay circuit may be implemented in the same manner, as the first transfer/delay circuit, except that each of the individual transfer/delay circuits transfers or delays the output control clock signal (as opposed to the internal clock signal) without delay or delays the output control clock signal by one, two or three cycles of the output control clock signal. The second transfer/delay circuit may also include a second multiplexer that selects one of the output control clock signals that is transferred or delayed via the plurality of individual transfer/delay circuits in response to the CAS latency signal.

Each of the individual transfer/delay circuits included in the first and second transfer/delay circuits may include three unit cycle delay circuits. The first unit cycle delay circuit may be used to delay the input clock signal by one cycle of the internal clock signal, the second unit cycle delay circuit may be used to delay the input clock signal that has already been delayed via the first unit cycle delay circuit by a second cycle of the internal clock signal, and the third unit cycle delay circuit may be used to delay the internal clock signal that has already been delayed via the first and second unit cycle delay circuits by a third cycle of the internal clock signal. Each individual transfer/delay circuit may further include a first fuse which can be used to transfer the input clock signal to the multiplexer without delay, a second fuse which can be used to transfer the input clock signal that was delayed via the first unit cycle delay circuit to the multiplexer, a third fuse which can be used to transfer the input clock signal that was delayed via the second unit cycle delay circuit to the multiplexer, and a fourth fuse which can be used to transfer the input clock signal that was delayed via the third unit cycle delay circuit to the multiplexer. Which signal is passed to the multiplexer will depend upon which of the fuses are cut.

Synchronous semiconductor memory devices according to embodiments of the present invention can synchronize source clocks of clock signals in an output control signal generating circuit which clock different types of clock signals. Thus, tolerance to a duty cycle error can be improved, and the influence of clock jitter can be reduced to provide more stable operations.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of generating an output control signal in response to a read command for a synchronous semiconductor memory device, the method comprising the steps of:
   generating a first clock signal from an external clock signal;
   generating a second clock signal from the external clock signal;
   passing the first clock signal through a delay circuit to provide a compensated first clock signal; and
   generating the output control signal based on a Column Address Strobe ("CAS") latency signal, the compensated first clock signal and the second clock signal.

2. The method according to claim 1, wherein the compensated first clock signal and the second clock signal are synchronized to the same cycle of the external clock signal.

3. The method according to claim 1, wherein the first clock signal is generated from an input delay locked-loop circuit so that the first clock signal is synchronized with the external clock signal after the lapse of an input locking time and wherein the second clock signal is generated from an output delay locked-loop circuit so that the second clock signal is synchronized with the external clock signal after the lapse of an output locking time; wherein the input locking time is different from the output locking time.

4. The method according to claim 1, wherein the step of passing the first clock signal through a delay circuit to provide a compensated first clock signal comprises passing the first clock signal through a delay circuit that delays the first clock signal by an integer number of clock cycles.

5. The method according to claim 1, wherein the step of passing the first clock signal through a delay circuit to provide a compensated first clock signal comprises passing the first clock signal through one or more unit cycle delay circuits.

6. The method according to claim 5, wherein the number of unit cycle delay circuits that the first clock signal is passed through is determined by which one of a plurality of fuses is left uncut.

7. The method according to claim 6, wherein the number of unit cycle delay circuits that the first clock signal is passed through is further based on the value of the Column Address Strobe ("CAS") latency signal.

8. A method of operating a synchronous semiconductor memory device, the method comprising the steps of:
   generating a first clock signal and a second clock signal that are synchronized to different cycles of an external clock signal;
   synchronizing the first clock signal and the second clock signal to the same cycle of the external clock signal; and
   generating a data output control signal in response to a read information signal, a Column Address Strobe ("CAS") latency signal and the synchronized first and second clock signals.

9. The method according to claim 8, wherein the first clock signal is an internal clock signal and the second clock signal is an output control clock signal.

10. The method according to claim 8, wherein the step of synchronizing the first clock signal and the second clock signal to the same cycle of the external clock comprises delaying at least one of the first clock signal and the second clock signal by an integer number of clock cycles.

11. The method according to claim 10, wherein the amount that the at least one of the first clock signal and the second clock signal are delayed varies based on the CAS latency signal.

12. The method according to claim 10, wherein the step of delaying at least one of the first clock signal and the second clock signal by an integer number of clock cycles comprises passing the at least one of the first clock signal and the second clock signal through at least one unit cycle delay circuit.

13. A synchronous semiconductor memory device for storing data comprising:

a first clock signal generation circuit that generates a first clock signal that is synchronized with a first cycle of an external source clock;

a second clock signal generation circuit that generates a second clock signal that is synchronized with a second cycle of the external source clock;

an output control signal generating circuit that generates an output control signal in response to a read signal, a Column Address Strobe ("CAS") latency signal, the first clock signal and the second clock signal;

a first transfer/delay circuit coupled between the first clock signal generation circuit and the output control signal generating circuit that delays the first clock signal before it is passed to the output control signal generating circuit so that the first clock signal and the second clock signal are synchronized to the same cycle of the external source clock; and an output buffer that outputs the data in response to the output control signal.

14. The synchronous semiconductor memory device according to claim 13, wherein the first transfer/delay circuit comprises a plurality of transfer/delay units that act to delay the first clock signal by zero, one, two or three clock cycles.

15. The synchronous semiconductor memory device according to claim 13, further comprising a second transfer/delay circuit coupled between the second clock signal generation circuit and the output control signal generating circuit that delays the second clock signal before it is passed to the output control signal generating circuit so that the second clock signal and the first clock signal are synchronized to the same cycle of the external source clock.

16. The synchronous semiconductor memory device according to claim 15, wherein the second transfer/delay circuit comprises a plurality of transfer/delay units that act to delay the second clock signal by zero, one, two or three clock cycles.

17. The synchronous semiconductor memory device according to claim 13, wherein the first transfer/delay circuit varies the delay time between the first clock signal and the delayed version of the first clock signal based on the CAS latency signal.

18. The synchronous semiconductor memory device according to claim 13, wherein the first clock signal is an internal clock signal and the second clock signal is an output control clock signal.

19. The synchronous semiconductor memory device according to claim 13, wherein the first transfer/delay circuit comprises:

a plurality of delay circuits, each of which includes a plurality of unit cycle delay circuits that act to delay the first clock signal by zero, one, two or three cycles; and a first multiplexer that, based on the CAS latency signal, selects the output of one of the delay circuits.

20. The synchronous semiconductor memory device according to claim 19, wherein each of the plurality of delay circuits comprises:

a first unit cycle delay circuit which delays the internal clock signal by one cycle of the internal clock signal;

a second unit cycle delay circuit which delays the internal clock signal that was delayed via the first unit cycle delay circuit by one cycle of the internal clock signal;

a third unit cycle delay circuit which delays the internal clock signal that was delayed via the second unit cycle delay circuit by one cycle of the internal clock signal;

a first fuse which transfers the internal clock signal to the first multiplexer without delay when the first fuse is not cut;

a second fuse which transfers the internal clock signal that was delayed via the first unit cycle delay circuit to the first multiplexer when the second fuse is not cut;

a third fuse which transfers the internal clock signal that was delayed via the second unit cycle delay circuit to the first multiplexer when the third fuse is not cut; and a fourth fuse which transfers the internal clock signal that was delayed via the third unit cycle delay circuit to the first multiplexer when the fourth fuse is not cut.

21. A synchronous semiconductor memory device comprising:

a first clock signal generation circuit that generates a first clock signal that is synchronized with a first cycle of an external source clock;

a second clock signal generation circuit that generates a second clock signal that is synchronized with a second cycle of the external source clock;

a delay circuit that operates on at least one of the first clock signal and the second clock signal to synchronize the first clock signal and the second clock signal to the same cycle of the external source clock; and an output control signal generation circuit that generates an output control signal in response to a read information signal, a Column Address Strobe ("CAS") latency signal and the synchronized first and second clock signals.

22. The synchronous semiconductor memory device according to claim 21, wherein the delay circuit comprises a plurality of transfer/delay units that act to delay the at least one of the first clock signal and the second clock signal by an integer number of clock cycles.

23. The synchronous semiconductor memory device according to claim 22, wherein the amount that the at least one of the first clock signal and the second clock signal are delayed varies based on the CAS latency signal.

* * * * *